United States Patent
Wahl et al.

(10) Patent No.: US 9,634,143 B1
(45) Date of Patent: Apr. 25, 2017

(54) METHODS OF FORMING FINFET DEVICES WITH SUBSTANTIALLY UNDOPED CHANNEL REGIONS

(71) Applicant: GLOBALFOUNDRIES Inc., Grand Cayman (KY)

(72) Inventors: Jeremy A. Wahl, Delmar, NY (US); Ryan W. Sporer, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/215,921

(22) Filed: Jul. 21, 2016

(51) Int. Cl.
| | |
|---|---|
| *H01L 29/78* | (2006.01) |
| *H01L 21/8238* | (2006.01) |
| *H01L 27/092* | (2006.01) |
| *H01L 29/06* | (2006.01) |
| *H01L 29/08* | (2006.01) |
| *H01L 29/16* | (2006.01) |
| *H01L 29/161* | (2006.01) |
| *H01L 29/165* | (2006.01) |

(Continued)

(52) U.S. Cl.
CPC .. *H01L 29/7848* (2013.01); *H01L 21/823814* (2013.01); *H01L 21/823821* (2013.01); *H01L 21/823828* (2013.01); *H01L 21/823878* (2013.01); *H01L 21/823892* (2013.01); *H01L 21/845* (2013.01); *H01L 27/0924* (2013.01); *H01L 27/0928* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/41791* (2013.01)

(58) Field of Classification Search
CPC ............ H01L 29/66795; H01L 29/785; H01L 21/823431; H01L 27/1211; H01L 21/845; H01L 27/0886; H01L 27/0924; H01L 21/823821; H01L 29/41791; H01L 21/265; H01L 27/10879; H01L 29/7848; H01L 29/0653; H01L 29/0847; H01L 29/1608; H01L 29/161; H01L 29/165; H01L 21/823892; H01L 27/0928; H01L 21/823878; H01L 21/823
See application file for complete search history.

(56) References Cited

U.S. PATENT DOCUMENTS 9,331,074 B1 * 5/2016 Chang ................. H01L 27/0886
2009/0321836 A1 * 12/2009 Wei .................... H01L 29/66628
257/365

(Continued)

*Primary Examiner* — Thanh T Nguyen
(74) *Attorney, Agent, or Firm* — Amerson Law Firm, PLLC

(57) ABSTRACT

One disclosed method includes forming a fin in a substrate by etching a plurality of fin-formation trenches, forming a layer of insulating material in the trenches, performing a densification anneal process on the layer of insulating material and, after performing the densification anneal process, performing at least one ion implantation process to form a counter-doped well region in the fin. The method also includes forming an undoped semiconductor material on an exposed upper surface of the fin, recessing the insulating material so as to expose at least a portion of the undoped semiconductor material and forming a gate structure around the exposed portion of the undoped semiconductor material.

27 Claims, 12 Drawing Sheets

(51) Int. Cl.
*H01L 21/84* (2006.01)
*H01L 29/417* (2006.01)

(56) References Cited

U.S. PATENT DOCUMENTS

| | | | |
|---|---|---|---|
| 2013/0092984 A1* | 4/2013 | Liu .................... | H01L 29/66795 257/288 |
| 2014/0159126 A1* | 6/2014 | Wei .................... | H01L 29/66795 257/288 |
| 2014/0239354 A1* | 8/2014 | Huang .............. | H01L 29/66545 257/288 |
| 2015/0187943 A1* | 7/2015 | Lee ....................... | H01L 29/785 257/192 |

* cited by examiner

METHODS OF FORMING FINFET DEVICES WITH SUBSTANTIALLY UNDOPED CHANNEL REGIONS

BACKGROUND OF THE INVENTION

1. Field of the Invention

Generally, the present disclosure relates to the manufacture of FET semiconductor devices, and, more specifically, to various methods of forming FinFET devices with substantially undoped channel regions.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region.

A conventional FET is a planar device wherein the entire channel region of the device is formed parallel and slightly below the planar upper surface of the semiconducting substrate. To improve the operating speed of planar FETs, and to increase the density of planar FETs on an integrated circuit product, device designers have greatly reduced the physical size of planar FETs over the past decades. More specifically, the channel length of planar FETs has been significantly decreased, which has resulted in improving the switching speed and in lowering operation currents and voltages of planar FETs. However, decreasing the channel length of a planar FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the planar FET as an active switch is degraded.

In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of fin-formation trenches 13, three illustrative fins 14, a gate structure 16, a sidewall spacer 18 and a gate cap layer 20. An insulating material 17 provides electrical isolation between the fins 14. The gate structure 16 is typically comprised of a layer of insulating material (not separately shown), e.g., a layer of high-k insulating material, and one or more conductive material layers that serve as the gate electrode for the device 10. The fins 14 have a three dimensional configuration: a height H, a width W and an axial length L. The axial length L corresponds to the gate length of the device, i.e., the direction of current travel in the device 10 when it is operational. The gate width of the device 10 is orthogonal to the gate length direction. The portions of the fins 14 covered by the gate structure 16 are the channel regions of the FinFET device 10. The portions of the fins 14 that are positioned outside of the spacers 18 will become part of the source/drain regions of the device 10.

In general, when forming a FinFET device, it is necessary to form a counter-doped well region in the fins 14, e.g., an N-doped well region for a PMOS device or a P-doped well region for an NMOS device. In one illustrative prior art flow, the following processing sequence was performed as it relates to the formation of such counter-doped well regions. First, an etching process was performed thorough a patterned fin-formation masking layer (not shown) to etch the trenches 13 into the substrate 12 so as to define the fins 14. Thereafter, the insulation material 17 was deposited such that it over-filled the trenches 13. Then, a chemical mechanical polishing process was performed using the patterned fin-formation hard mask as a polish-stop so as to remove excess portions of insulating material 17 positioned above the patterned fin-formation hard mask. Next, a selective etching process was performed so as to remove the patterned fin-formation hard mask and expose the upper surface of the fins 14. Then, an ion implantation process was performed to form a counter-doped well region in the fins 14. At that point, a densification anneal process (e.g., at a temperature of about 500-1200° C. for a duration of about 1-120 minutes) was performed to increase the quality of the insulation material 17 and thereby make it a better isolation structure. Thereafter, various process operations were performed to complete the device, e.g., the insulation material 17 was recessed so as to expose the desired amount of the fins 14, the gate structure was formed around the exposed portions of the fins 14 and above the recessed isolation material 17, halo implant regions and source/drain implant regions were formed in the fins 14, etc. By performing this process sequence, the portion of the fin 14 that becomes the channel region of the device, i.e., the portion under the gate structure, contains the dopant from the counter-doped well region.

Device designers are continuously in search of ways to improve device performance. For example, device designers try to increase the mobility of charge carriers (i.e., electrons for NMOS devices and holes for PMOS devices). One technique that has been employed to increase charge carrier mobility involves stress engineering. In general, various techniques are performed to create a tensile strained channel region for an NMOS device and/or a compressively strained channel region for a PMOS device. As device scaling continues, it has become apparent that the presence of the dopants from the counter-doped well region in the channel region of FinFET devices tends to limit device performance. Thus, device designers are seeking to form FinFET devices with so-called SSRW regions (Super Steep Retrograde Well regions) wherein there is little to no dopant present in the channel region of the FinFET devices.

FIG. 1B depicts one illustrative prior art technique that has been attempted to form such undoped channel regions for FinFET devices. As shown therein, the process involved initially forming the doped well regions 22 across the entire substrate 12 prior to the formation of the fins 14. Of course, using appropriate masking layers, a plurality of N-doped and P-doped well region were formed across the substrate 12. Then, an epitaxial deposition process was performed to form an undoped layer of semiconductor material 24, e.g., silicon, across the entire substrate 12. After the semiconductor material 24 was formed, then the trenches were etched into the substrate 12 to define the fins 14, the isolation material 17 was deposited and recessed, etc. Unfortunately, using the approach depicted in FIG. 1B, the "thermal budget" allowed for performing the densification anneal process is severely limited so as not to cause dopants in the counter-doped well region 22 to migrate into the previously undoped layer of semiconductor material 24. However, limiting the temperatures and/or duration of the densification anneal process means that the insulation material 17 will not be as high of a quality of insulation material as would otherwise be desired, thereby limiting its effectiveness as an isolation structure and making it more susceptible to attack and degradation when performing later processing operations.

The present disclosure is directed to various methods of forming FinFET devices with substantially undoped channel regions that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming FinFET devices with substantially undoped channel regions. One illustrative method disclosed herein includes, among other things, forming a plurality of fin-formation trenches to thereby define a fin, forming a layer of insulating material in the trenches, after forming the insulation material, performing a densification anneal process on the layer of insulating material and, after performing the densification anneal process, performing at least one ion implantation process to form a counter-doped well region in the fin. In this example the method also includes forming an undoped semiconductor material on an exposed upper surface of the fin, recessing the layer of insulating material so as to expose at least a portion of the undoped semiconductor material and forming a gate structure around the exposed portion of the undoped semiconductor material.

Another illustrative method disclosed herein of forming a FinFET device on a substrate comprising a strain relaxation buffer (SRB) layer comprised of a first semiconductor material includes, among other things, forming a plurality of fin-formation trenches that extend at least partially into the SRB layer so as to define a fin, wherein at least a portion of the fin is comprised of the SRB layer, forming a layer of insulating material in the plurality of fin-formation trenches and performing a densification anneal process on the layer of insulating material. In this example, the method also includes, after performing the densification anneal process, forming a counter-doped well region in the SRB layer portion of the fin, forming an undoped semiconductor material on an exposed upper surface of the SRB layer portion of the fin, wherein the undoped semiconductor material comprises a second semiconductor material that is different from the first semiconductor material, recessing the layer of insulating material so as to expose at least a portion of the undoped semiconductor material and forming a gate structure around the exposed portion of the undoped semiconductor material.

BRIEF DESCRIPTION OF THE DRAWINGS

The disclosure may be understood by reference to the following description taken in conjunction with the accompanying drawings, in which like reference numerals identify like elements, and in which.

Figure 1A:
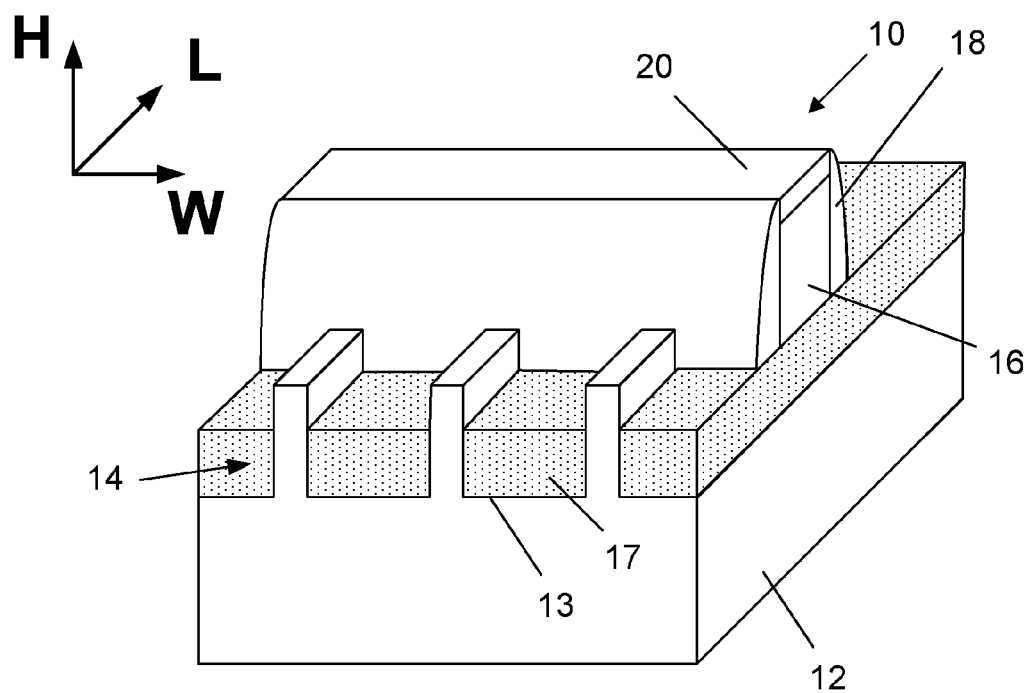
FIG. 1A depicts an example of prior art FinFET devices wherein the fins for the device are comprised of the substrate material.
Figure 1B:
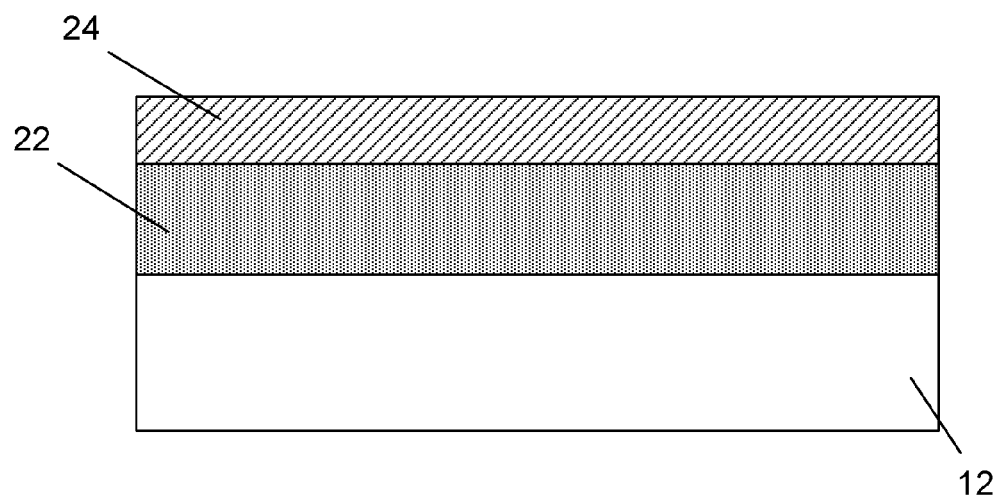
FIG. 1B depicts an example of prior art FinFET devices wherein the fins for the device are comprised of an alternative fin material formed above a substrate fin.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The methods disclosed herein may be employed in manufacturing N-type devices and/or P-type devices, and the gate structure of such devices may be formed using either so-called "gate-first" or "replacement gate" ("gate-last" or "gate-metal-last") techniques. As will be readily apparent to those skilled in the art upon a complete reading of the present application, the present method is applicable to a variety of integrated circuit products, including, but not limited to, ASICs, logic products, memory products, etc. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
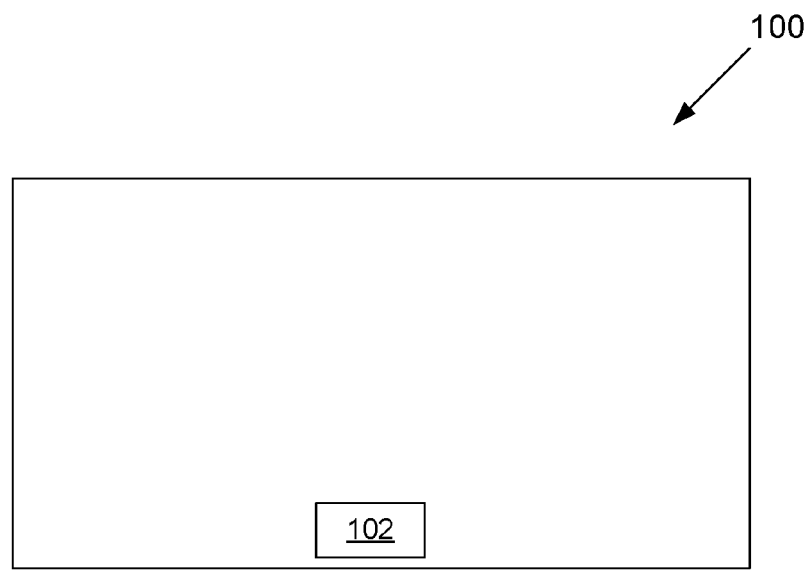
FIGS. 2A-2N depict various illustrative novel methods disclosed herein for forming FinFET devices with substantially undoped channel regions.
Figure 2B:
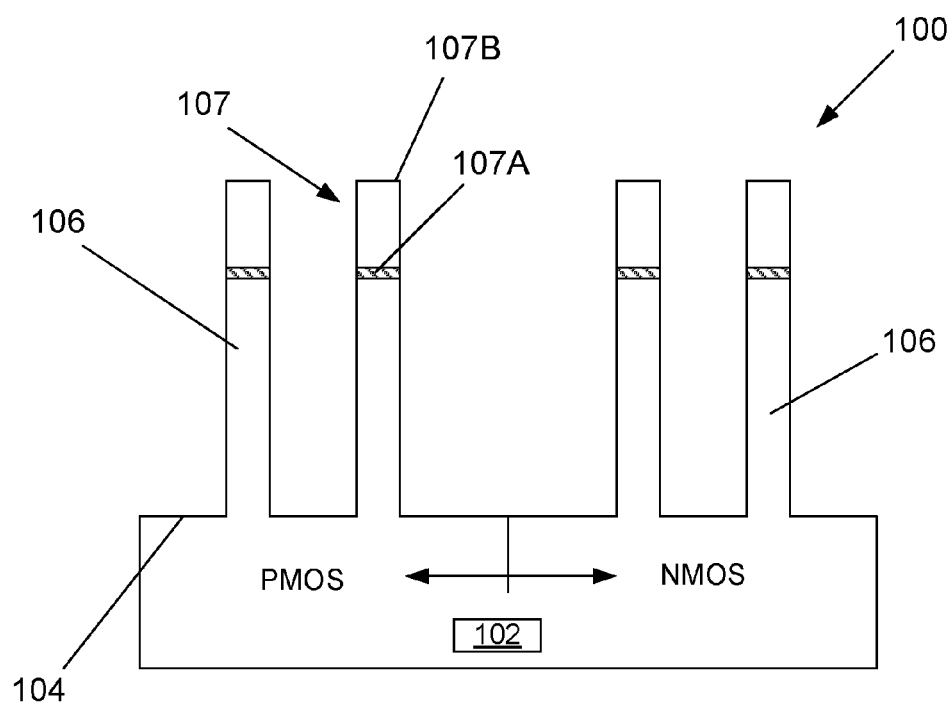
Figure 2C:
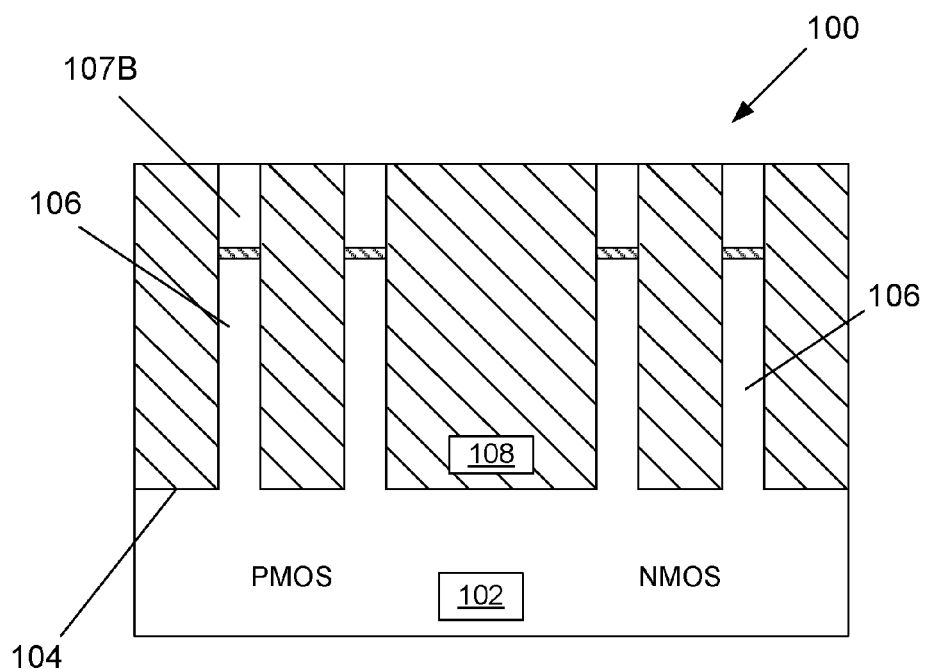
Figure 2D:
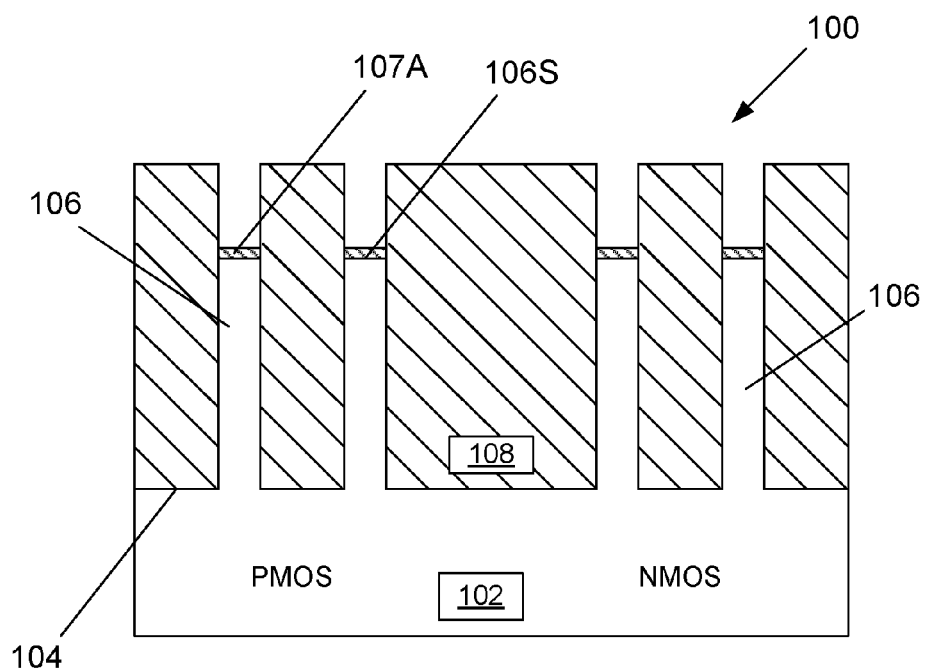
Figure 2E:
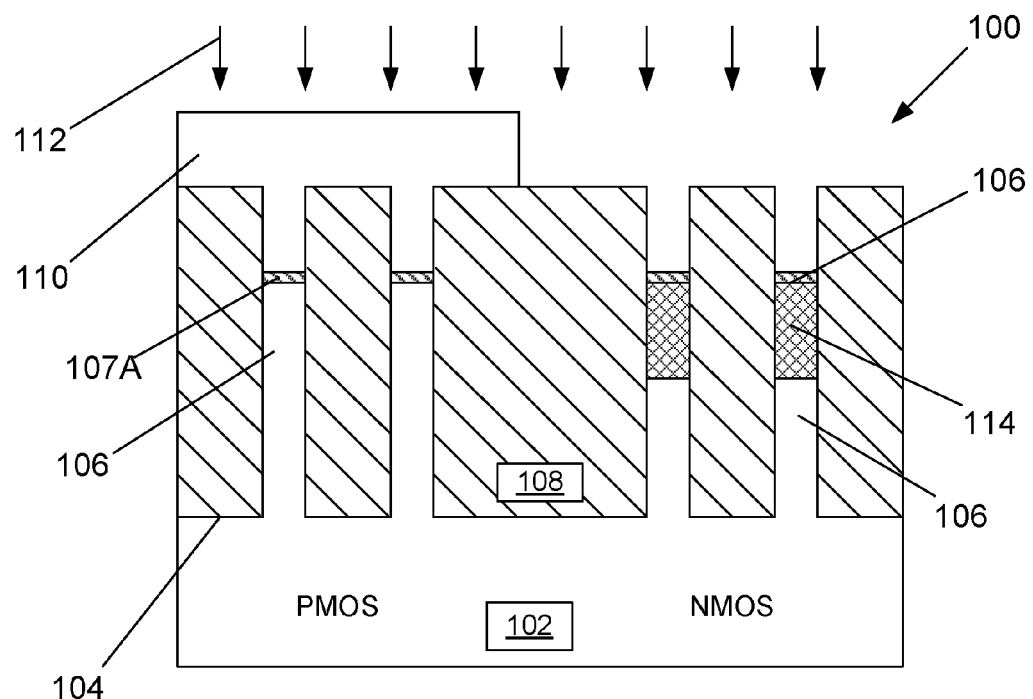
Figure 2F:
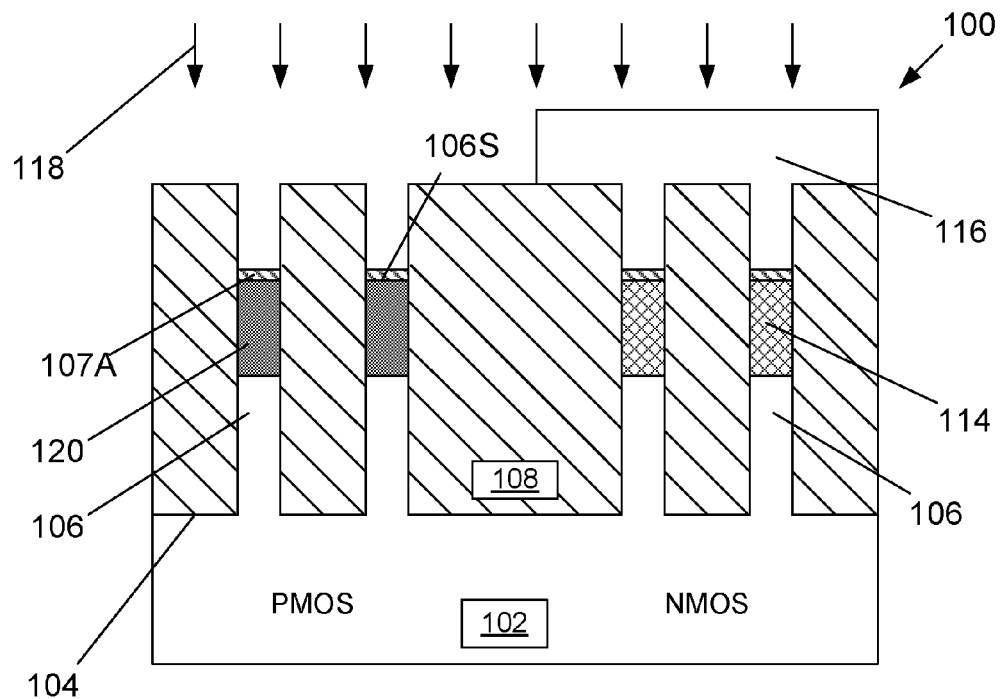
Figure 2G:
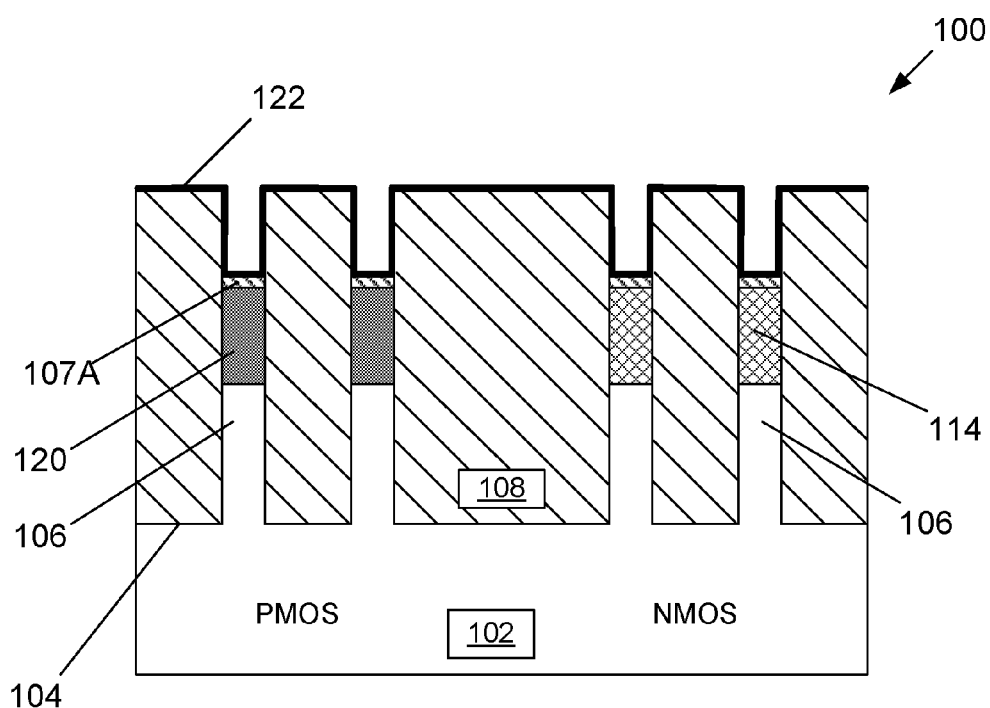
Figure 2H:
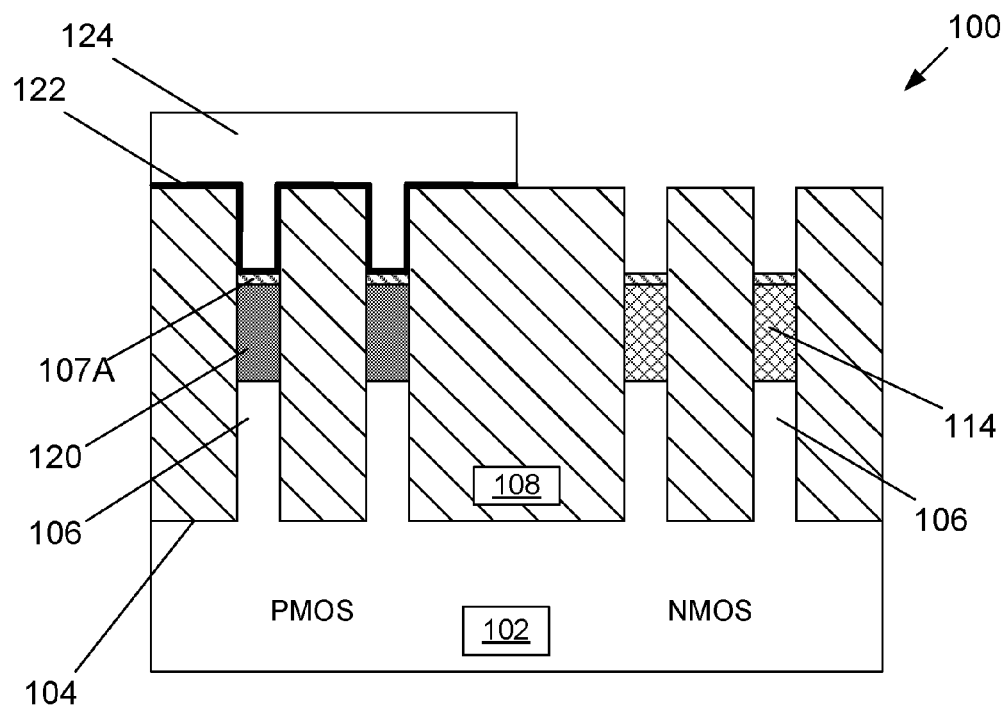
Figure 2I:
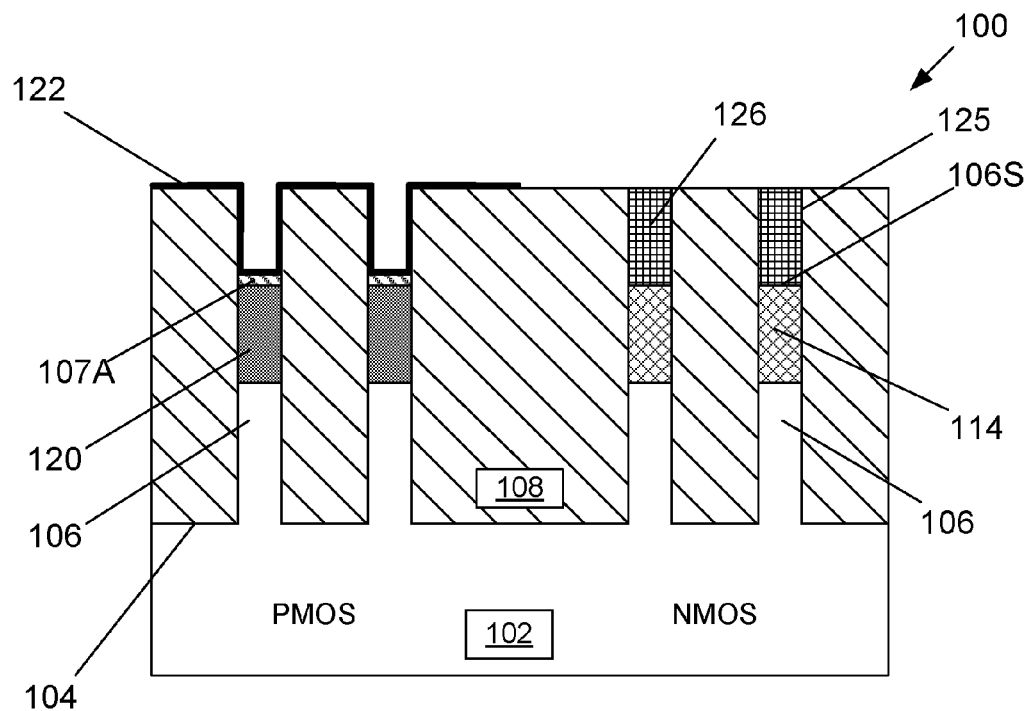
Figure 2J:
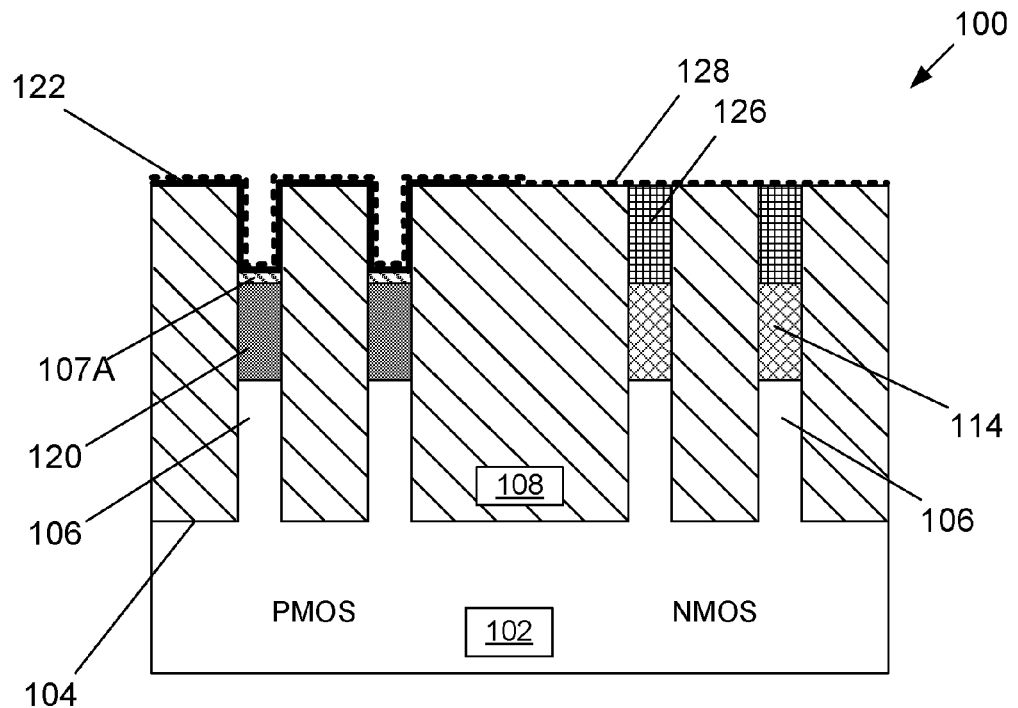
Figure 2K:
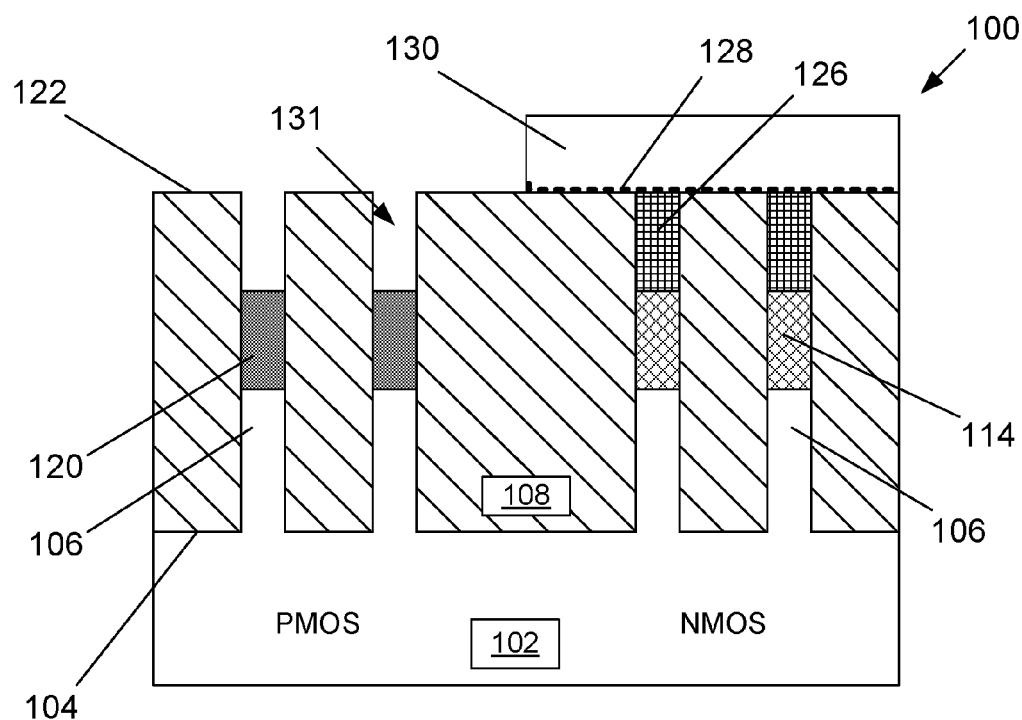
Figure 2L:
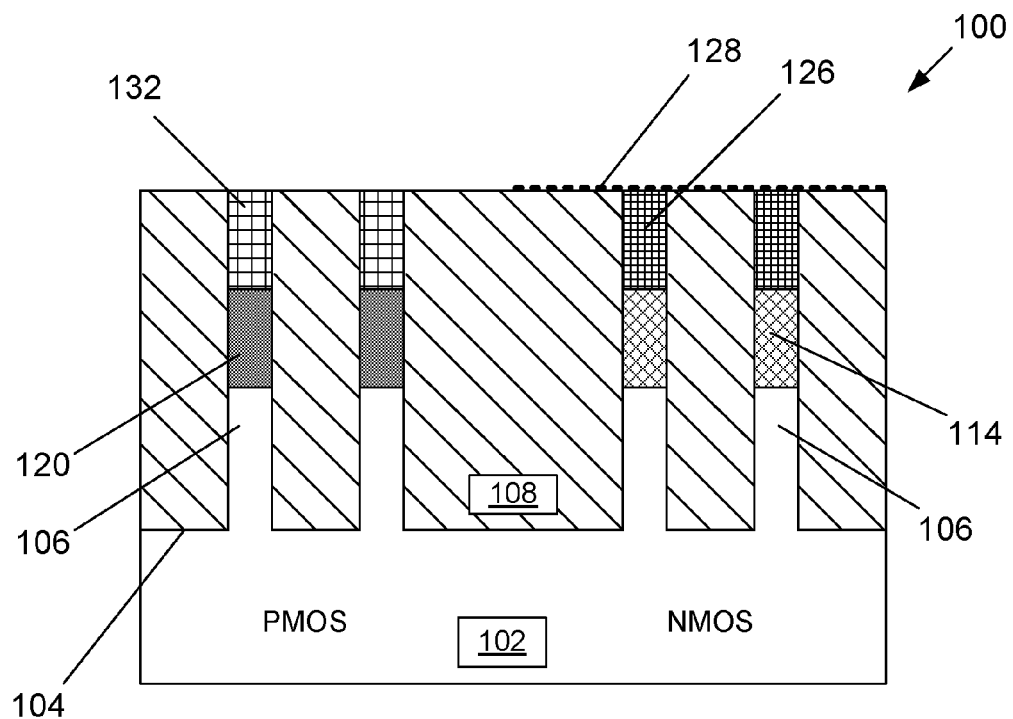
Figure 2M:
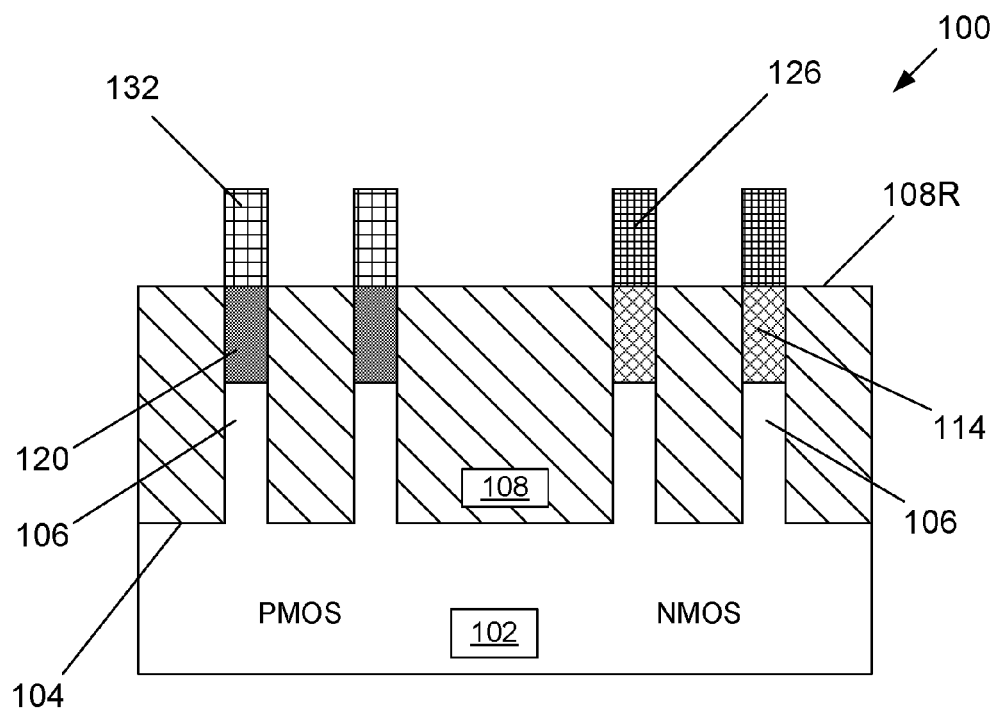
Figure 2N:
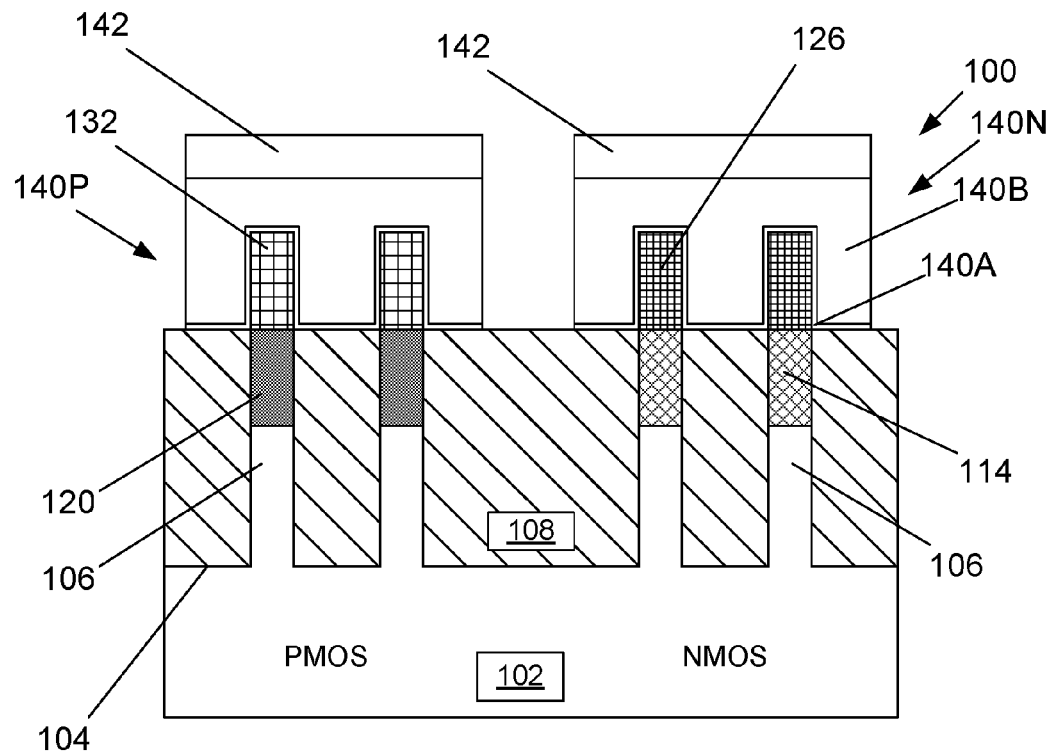

FIGS. 2A-2N depict various illustrative novel methods disclosed herein for forming FinFET devices with substantially undoped channel regions. The illustrative examples of the methods disclosed herein will be depicted in the context of forming PMOS and NMOS FinFET devices on a CMOS based integrated circuit product 100. Of course, the integrated circuit depicted herein may also include other types of FET devices, such as planar FETs. With reference to FIG. 2A, the product 100 depicted herein will be formed above a semiconductor substrate 102. The substrate 102 may have a variety of configurations, such as a semiconductor-on-insulator (SOI) that includes a bulk semiconductor layer, a buried insulation layer formed on the bulk layer and an active semiconductor layer formed on the buried insulation layer. The active layer may be comprised of any of a variety of different semiconductor materials, e.g., silicon, silicon-germanium, germanium, etc. Similarly, the bulk semiconductor layer may also be comprised of a variety of different materials. The active layer and the bulk semiconductor layer need not be formed of the same semiconductor material although that may be the case in some applications. Alternatively, the substrate 102 may have a simple bulk configuration. Thus, the terms "substrate" or "semiconductor substrate" should be understood to cover all semiconducting materials and all forms of such materials.

FIG. 2B depicts the product 100 after one or more etching processes, e.g., anisotropic etching processes, were performed through a patterned fin-formation etch mask 107 to form a plurality of fin-formation trenches 104 and thereby define a plurality of overall fin structures 106. The patterned fin-formation hard mask 107 may be comprised of one or more layer of materials and it may be formed to any desired overall thickness. In the depicted example, the patterned fin-formation hard mask 107 is comprised of a relatively thin layer of silicon dioxide 107A and a relatively thicker layer of silicon nitride 107B. The patterned fin-formation hard mask 107 may be formed by depositing the layer or layers of material of the patterned fin-formation hard mask 107 above the upper surface of the substrate 102 and thereafter patterning those layers of material using known photolithography and etching techniques.

With continuing reference to FIG. 2B, the width and height of the overall fin structures 106 may vary depending upon the particular application. Additionally, the overall size, shape and configuration of the fin-formation trenches 104 and overall fin structures 106 may vary depending on the particular application. In the illustrative examples depicted in the attached drawings, the fin-formation trenches 104 and the fins 106 are all depicted as having a uniform size and shape. However, such uniformity in the size and shape of the trenches 104 and the fins 106 is not required to practice at least some aspects of the inventions disclosed herein. In the attached figures, the fin-formation trenches 104 are depicted as having been formed by performing an anisotropic etching process that results in the overall fin structures 106 having a schematically (and simplistically) depicted, generally rectangular configuration. In an actual real-world device, the sidewalls of the fins 106 may be somewhat outwardly tapered (i.e., the fins may be wider at the bottom of the fin than they are at the top of the fin) although that configuration is not depicted in the attached drawings. Thus, the size and configuration of the trenches 104 and the fins 106, and the manner in which they are made, should not be considered a limitation of the present invention. For ease of disclosure, only the substantially rectangular trenches 104 and fins 106 will be depicted in the subsequent drawings. Moreover, the product 100 may be formed with any desired number of fins 106. In the example depicted herein, the product 100 will be comprised of an NMOS device and a PMOS device, as depicted in FIG. 2B, each of which is comprised of two of the illustrative fins 106 at this point in the process flow.

FIG. 2C depicts the product 100 after a layer of insulating material 108 (e.g., silicon dioxide) was deposited so as to overfill the fin-formation trenches 104 and after at least one process operation, such as a chemical mechanical polishing (CMP) process, was performed to planarize the upper surface of the layer of insulating material 108 with the upper surface of the patterned fin-formation hard mask 107. Then, a densification anneal process (e.g., at a temperature of about 500-1200° C. for a duration of about 1-120 minutes) was performed to increase the quality of the insulation material 108 and thereby make it a better isolation structure. If desired, the densification anneal process may be performed at any time after the insulating material 108 is deposited, e.g., the anneal process may be performed prior to performing the CMP process and/or after the CMP process is performed. Importantly, the densification anneal process is performed prior to the formation of any counter-doped well regions in the fins 106. By performing the densification anneal process prior to forming the counter-doped well regions, migration of the dopant material in the counter-doped well regions into the channel region of the devices is prevented or greatly reduced.

FIG. 2D depicts the product 100 after an etching process was performed to remove the upper layer 107B of the patterned fin-formation hard mask 107. The process leaves the lower layer 107A in position on top of the upper surface 106S of the fins 106.

The next major process operation involves forming counter-doped well regions in the fins 106 for the NMOS and PMOS devices, i.e., a P-doped well region for the NMOS device and an N-doped well region for the PMOS device. The formation of the doped well regions may be performed in any order, i.e., the counter-doped well region for the NMOS device may be formed prior to forming the counter-doped well region for the PMOS device or vice-versa. In the illustrative example depicted herein, the NMOS device will be processed before the PMOS device. Accordingly, FIG. 2E depicts the product 100 after several process operations were performed. First, a masking layer 110, such as a patterned layer of photoresist, was formed so as to cover the PMOS region and expose the NMOS region for further processing. Next, an ion implantation process 112 was performed though the masking layer 110 so as to form a P-doped well region 114 in the fins 106 for the NMOS device. In one illustrative embodiment, the P-well implant process 112 may be performed using, for example, boron, boron difluoride, carbon, etc. at a dopant dose of about $1\times10^{10}$ $1\times10^{18}$ ions/cm$^2$ and at an energy level of about 5-120 keV. In this illustrative example, the P-doped well region 114 may have a depth of about 20-200 nm from the upper surface 106S of the fins 106.

FIG. 2F depicts the product 100 after several process operations were performed. First, the masking layer 110 was removed. Then, another masking layer 116, such as a patterned layer of photoresist, was formed so as to cover the NMOS region and expose the PMOS region for further processing. Next, an ion implantation process 118 was performed though the masking layer 116 so as to form an N-doped well region 120 in the fins 106 for the PMOS device. In one illustrative embodiment, the N-well implant process 118 may be performed using, for example, arsenic, phosphorous, carbon, etc. at a dopant dose of about $1\times10^{10}$-$1\times10^{18}$ ions/cm$^2$ and at an energy level of about 20-300 keV. In this illustrative example, the N-doped well region 120 may have a depth of about 20-200 nm from the upper surface 106S of the fins 106.

FIG. 2G depicts the product 100 after several process operations were performed. First, the patterned masking layer 116 was removed. Then, a conformal deposition process, such as an ALD process, was performed to form a thin protection layer 122, e.g., silicon nitride, on both the NMOS and PMOS devices. In one embodiment, the protection layer 122 may have a thickness of about 3-5 nm.

FIG. 2H depicts the product 100 after several process operations were performed. First, another patterned masking layer 124, such as a patterned layer of photoresist, was formed so as to cover the PMOS region and expose the NMOS region for further processing. Then, an etching process was performed to remove the exposed portions of the protection layer 122 from above the NMOS device.

FIG. 2I depicts the product 100 after several process operations were performed. First, the patterned masking layer 124 was removed. Then, an etching process was performed to remove the lower layer 107A of the patterned fin-formation hard mask 107 on the NMOS device and thereby expose the upper surface 106S of the fins 106 of the NMOS device. This results in the formation of a fin cavity 125 above the fins 106 and between the insulating material 108. Then, an epitaxial deposition process was performed to form an undoped (as deposited) semiconductor material 126 in the fin cavities 125 on the exposed upper surface 106S of the fins 106 for the NMOS device. In one illustrative embodiment, the semiconductor material 126 may be, for example, a fully-strained, substantially defect-free substantially pure silicon, silicon germanium or silicon carbon material. As will be appreciated by those skilled in the art after a complete reading of the present application, the semiconductor material 126 will become the undoped channel semiconductor material for the NMOS device. In some cases, a thin layer of carbon may be formed in an effort to suppress dopant diffusion. Of course, depending upon the thermal processing to which the device is exposed after the formation of the undoped (as deposited) semiconductor material 126, some amount of dopant may end up in the channel region in a finished device. In one embodiment, the growth of the semiconductor material 126 may be controlled such that it remains entirely within the fin cavities 125. In other embodiments, the semiconductor material 126 may be formed such that it overfills the fin cavities 125. In such a situation, a CMP process may be performed to remove excess amounts of the semiconductor material 126 positioned outside of the fin cavities 125. If desired, the semiconductor material 126 may be formed with a tensile strain to enhance charge carrier (i.e., electrons) mobility of the NMOS device, and thus its performance. However, to achieve a tensile strain on the NMOS device, the substrate on which the NMOS device is formed would need to be a material that is lattice mismatched relative to the channel semiconductor material 126 so as to impart the desired tensile strain to the channel semiconductor material 126, e.g., the substrate on which the NMOS device is formed may comprise a strain relaxation buffer layer comprised of silicon germanium in the case where the channel semiconductor material 126 is substantially pure silicon.

FIG. 2J depicts the product 100 after another conformal deposition process, such as an ALD process, was performed to form another thin protection layer 128, e.g., silicon nitride on both the NMOS and PMOS devices. The protection layer 128 is depicted with a dashed line so as to distinguish it from the protection layer 122. The protection layer 128 may be made of the same material and have the same thickness as that of the above-described protection layer 122.

FIG. 2K depicts the product 100 after several process operations were performed. First, another patterned masking layer 130, such as a patterned layer of photoresist, was formed so as to cover the NMOS region and expose the PMOS region for further processing. Then, an etching process was performed to remove the exposed portions of the protection layers 128, 122 from above the PMOS device. Then, an etching process was performed to remove the lower layer 107A of the patterned fin-formation hard mask 107 on the PMOS device and thereby expose the upper surface 106S of the fins 106 of the PMOS device. This results in the formation of a fin cavity 131 above the fins 106 and between the insulating material 108.

FIG. 2L depicts the product 100 after several process operations were performed. First, the patterned masking layer 130 was removed. Then, an epitaxial deposition process was performed to form undoped (as deposited) semiconductor material 132 in the fin cavities 131 on the exposed upper surface 106S of the fins 106 for the PMOS device. In one illustrative embodiment, the semiconductor material 132 may be a fully-strained, substantially defect-free material. For example, if the substrate 102 is made of silicon, the semiconductor material 132 may be made of silicon germanium ($Si_{(1-x)}Ge_x$ where "x" ranges from 0.1-1), such as $Si_{0.75}Ge_{0.25}$ or $Si_{0.50}Ge_{0.5}$, substantially pure germanium, a III-V material, etc. As will be appreciated by those skilled in the art after a complete reading of the present application, the semiconductor material 132 will become the undoped channel semiconductor material for the PMOS device. In one embodiment, the growth of the semiconductor material 132 may be controlled such that it remains entirely within the fin cavities 131. In other embodiments, the semiconductor material 132 may be formed such that it overfills the fin cavities 131. In such a situation, a CMP process may be performed to remove excess amounts of the semiconductor material 132 positioned outside of the fin cavities 131. If desired, the semiconductor material 132 may be formed with a compressive strain to enhance charge carrier (i.e., holes) mobility of the PMOS device, and thus its performance. In one illustrative example where the substrate is silicon, the channel semiconductor material 132 may be comprised of silicon germanium so as to achieve the desired compressive strain due to the lattice mismatch between the two materials. It should be noted that, in the illustrative process flow depicted herein, the channel semiconductor material 126 was formed on the NMOS device prior to forming the channel semiconductor material 132 on the PMOS device, but the process could have been reversed if desired, i.e., the PMOS device could be processed prior to processing the NMOS device.

FIG. 2M depicts the product 100 after the remaining portion of the protection layer 128 (if still present) was removed and after a recess etching process was performed on the layer of insulating material 108 so as to expose all or a portion of the semiconductor materials 126, 132 above the recessed upper surface 108R of the layer of insulating material 108. In some illustrative embodiments, the exposed fin height may range from about 20-100 nm.

At the point of processing depicted in FIG. 2M, the illustrative FinFET-based CMOS product 100 may be completed using traditional fabrication techniques. For example, FIG. 2N depicts the product after illustrative and representative gate structures 140P, 140N and gate cap layers 142 were formed for the PMOS and NMOS devices. Of course, the materials of construction for the gate structure 140N of the NMOS device may be (and likely will be) different from the gate structure 140P of the PMOS device. In one illustrative embodiment, the schematically depicted gate structures 140P, 140N include an illustrative gate insulation layer 140A and an illustrative gate electrode 140B. The gate insulation layer 140A may be comprised of a variety of different materials, such as, for example, silicon dioxide, a so-called high-k (k greater than 10) insulation material (where k is the relative dielectric constant), etc. Similarly, the gate electrode 140B may also be of a material such as polysilicon or amorphous silicon, or it may be comprised of one or more metal layers that act as the gate electrode 140B. As will be recognized by those skilled in the art after a complete reading of the present application, the gate structures 140P, 140N of the product 100 depicted in the drawings, i.e., the gate insulation layer 140A and the gate electrode 140B, are intended to be representative in nature. That is, the gate structures 140P, 140N may be comprised of a variety of different materials and they may have a variety of configurations. The gate structures 140P, 140N may be manufactured using either the so-called "gate-first" or "replacement gate" techniques. After the gate structures 140P, 140N are formed, other processing activities may also be performed, e.g., the formation of doped halo implant regions (not shown), doped source/drain regions (not shown), the formation of epi semiconductor material (not shown) in the source/drain regions, etc.

Figure 3A:
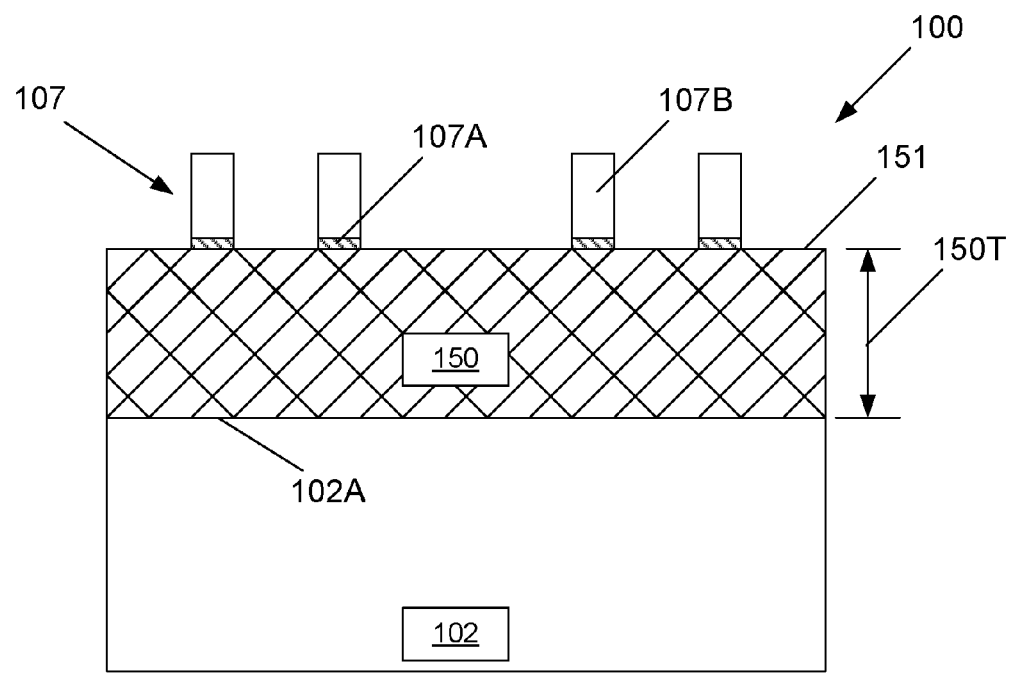
FIGS. 3A-3H depict yet other illustrative novel methods disclosed herein for forming FinFET devices with substantially undoped channel regions.

FIGS. 3A-3H depict yet other illustrative novel methods disclosed herein for forming FinFET devices with substantially undoped channel regions. In general, this embodiment involves, among other things, the formation of a so-called SRB (strained relaxed buffer) layer 150 on the upper surface 102A of the substrate 102 prior to the formation of the fins 106, as shown in FIG. 3A. Also depicted in FIG. 3A is the above-described fin-formation hard mask 107 that was formed above the SRB layer 150. In some cases, the starting substrate obtained from a wafer supplier may include the SRB layer 150. In other cases, the SRB layer 150 may be formed on a bulk silicon substrate 102 at the beginning of the fabrication process by performing an epitaxial deposition process. In one illustrative embodiment, the SRB layer 150 is formed to a sufficient thickness 150T (e.g., greater than about 1 μm) such that it is fully-relaxed and has a substantially defect-free upper surface 151. The SRB layer 150 may be comprised of any desired material, but it should be selected such that there will be a lattice mismatch between the material of the SRB layer 150 and the undoped channel semiconductor materials 126, 132 so that a desired strain may be imparted to the channel semiconductor materials 126, 132 when they are formed on the SRB layer 150, as discussed more fully below. In one illustrative embodiment, the lattice constant for the SRB layer 150 may be at least 0.2% greater than the lattice constant of the channel semiconductor material 126 for the NMOS device and the lattice constant of the SRB layer 150 should be at least 0.2% less than the lattice constant of the channel semiconductor material 132 for the PMOS device. In one illustrative embodiment, the SRB layer 150 may be a silicon germanium material having a relatively low percentage of germanium, e.g., 5-20% or less ($Si_{1-x}Ge_x$; x=0.05-0.2).

Figure 3B:
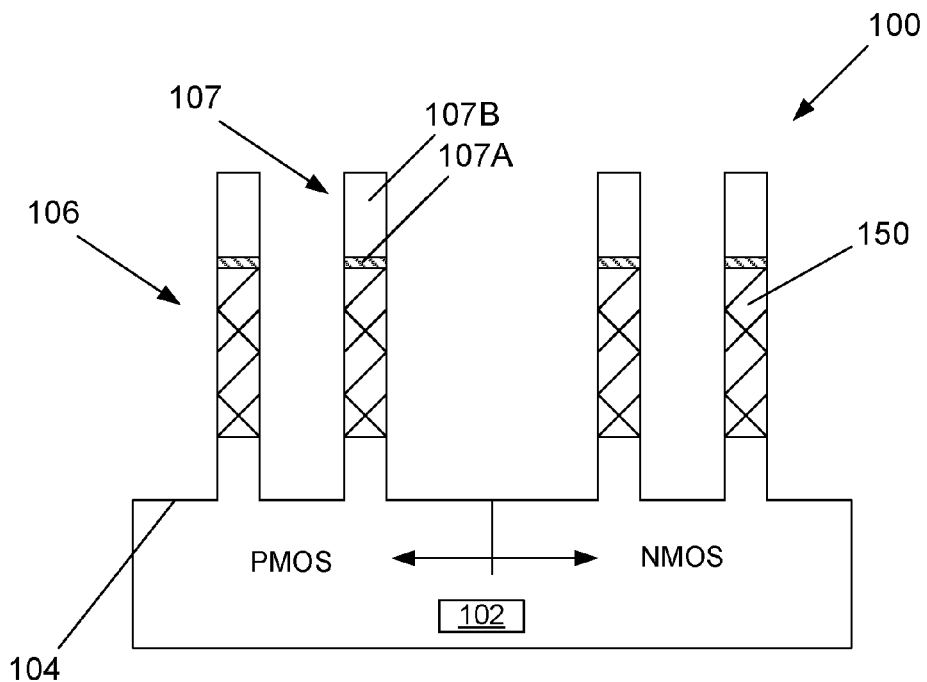

FIG. 3B depicts the product 100 after one or more etching processes, e.g., anisotropic etching processes, were performed through the patterned fin-formation etch mask 107 to form the plurality of fin-formation trenches 104 and thereby define a plurality of overall fin structures 106, wherein at least an upper portion of the fin 106 is comprised of a portion of the SRB layer 150. In some cases, like that depicted, the trenches 104 may extend through the SRB layer 150 and into the substrate 102 which results in an upper portion of the fin 106 being comprised of a portion of the SRB layer and a lower portion of the fin is comprised of a portion of the substrate 102. In other applications, the depth of the trenches 104 may not exceed the thickness 150T of the SRB layer 150 and, as a result, the fin 106 may be comprised of only the SRB layer material.

Figure 3C:
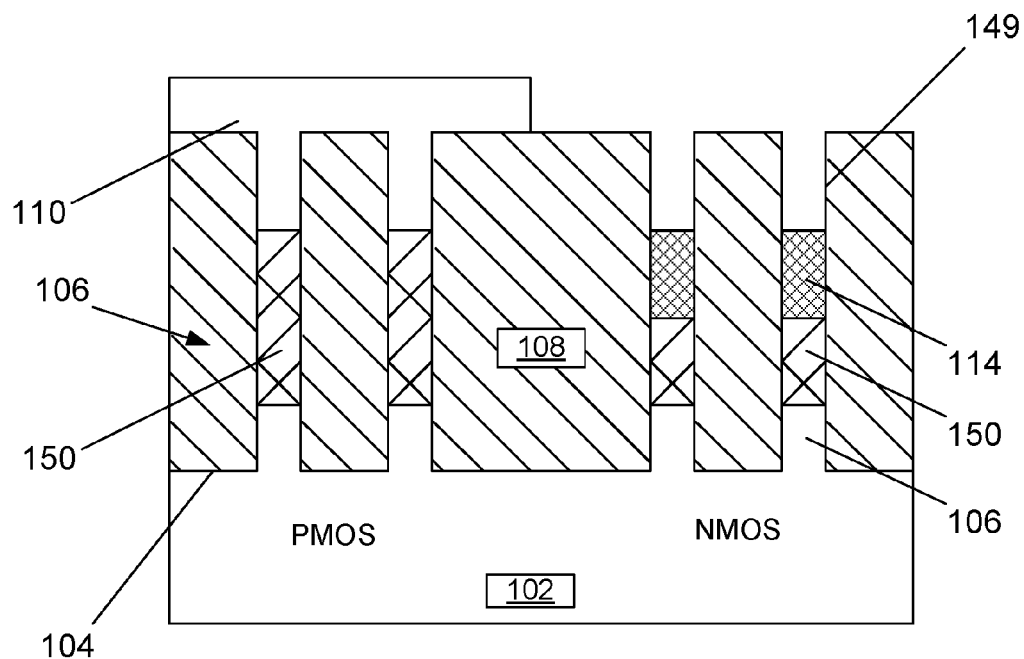

FIG. 3C depicts the product 100 after several process operations were performed. First, the above-described layer of insulating material 108 was deposited so as to overfill the fin-formation trenches 104 and at least one process operation, such as a CMP process, was performed to planarize the upper surface of the layer of insulating material 108 with the upper surface of the patterned fin-formation hard mask 107. Then, the above-described densification anneal process was performed to increase the quality of the insulation material 108 and thereby make it a better isolation structure. As noted above, the densification anneal process may be performed at any time after the insulating material 108 is deposited, e.g., the anneal process may be performed prior to performing the CMP process and prior to the formation of any counter-doped well regions in the fins 106. As also noted above, by performing the densification anneal process prior to forming the counter-doped well regions, migration of the dopant material in the counter-doped well regions into the channel region of the devices is prevented or greatly reduced. Next, the patterned fin-formation masking layer 107 was removed and results in the formation of a fin cavity 149 above the SRB layer 150 and between portions of the layer of insulating material 108. Then, the above-described masking layer 110 was formed so as to cover the PMOS region and expose the NMOS region for further processing. Thereafter, the above-described P-well implant process 112 was performed though the masking layer 110 so as to form the above-described P-doped well region 114 in the SRB layer 150 on the NMOS device.

Figure 3D:
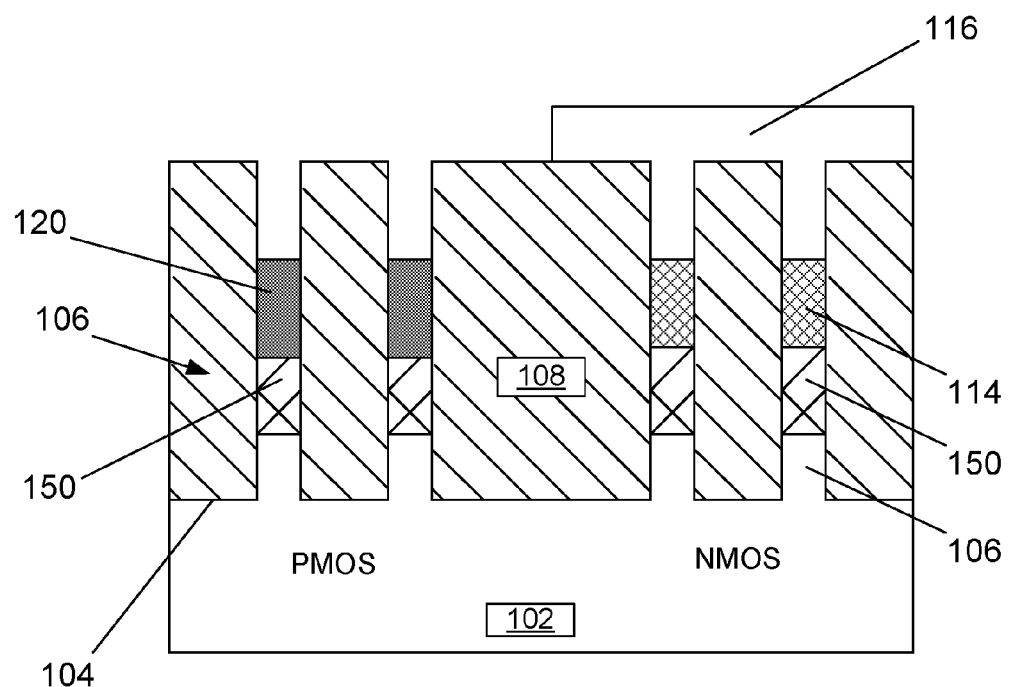

FIG. 3D depicts the product 100 after several process operations were performed. First, the above-described masking layer 110 was removed. Then, the above-described masking layer 116 was formed so as to cover the NMOS region and expose the PMOS region for further processing. Next, the above-described N-well implant process 118 was performed though the masking layer 116 so as to form the above-described N-doped well region 120 in the SRB layer 150 for the PMOS device.

Figure 3E:
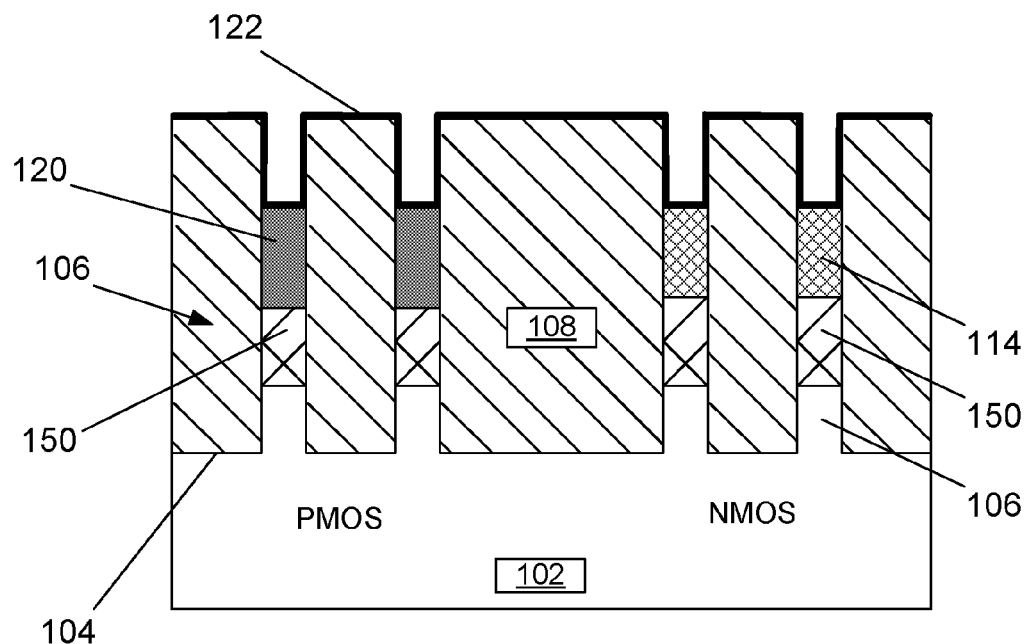

FIG. 3E depicts the product 100 after several process operations were performed. First, the patterned masking layer 116 was removed. Then, the above-described thin protection layer 122, e.g., silicon nitride, was formed on both the NMOS and PMOS devices.

Figure 3F:
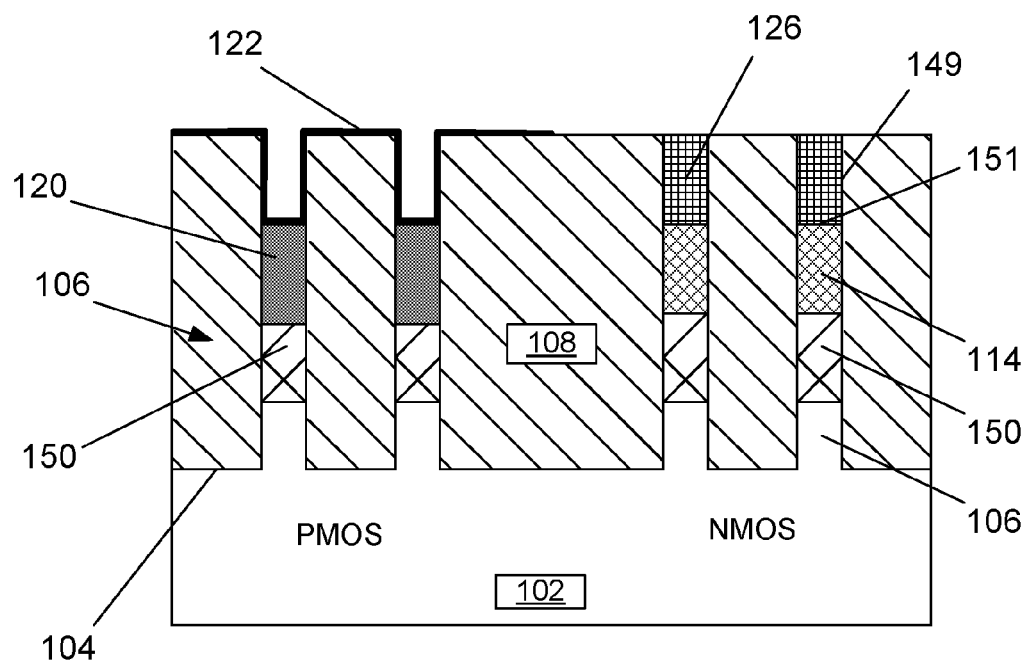

FIG. 3F depicts the product 100 after several process operations were performed. First, the portion of the protection layer 122 above the NMOS device was removed by performing an etching process through another patterned masking layer (not shown). Then, the patterned masking layer was removed, leaving the remaining portion of the protection layer 122 in position above the PMOS device. Thereafter, an epitaxial deposition process was performed to form the above-described undoped semiconductor material 126 in the fin cavities 149 on the exposed upper, substantially defect-free upper surface 151 of the SRB layer 150 in the NMOS device. In general, the semiconductor material 126 may be made of a material that has a lattice constant that is less than that of the material of the SRB layer 150 such that a tensile strain is created on the semiconductor material 126 when it is formed, which will tend to improve the mobility of the charge carriers (electrons) of the NMOS device. In one illustrative embodiment, the lattice constant of the channel semiconductor material 126 for the NMOS device should be at least 0.2% less than the lattice constant of the SRB layer 150. In one illustrative embodiment, the resulting channel semiconductor material 126 is a tensile-strained, substantially defect-free substantially pure silicon or silicon carbon material.

Figure 3G:
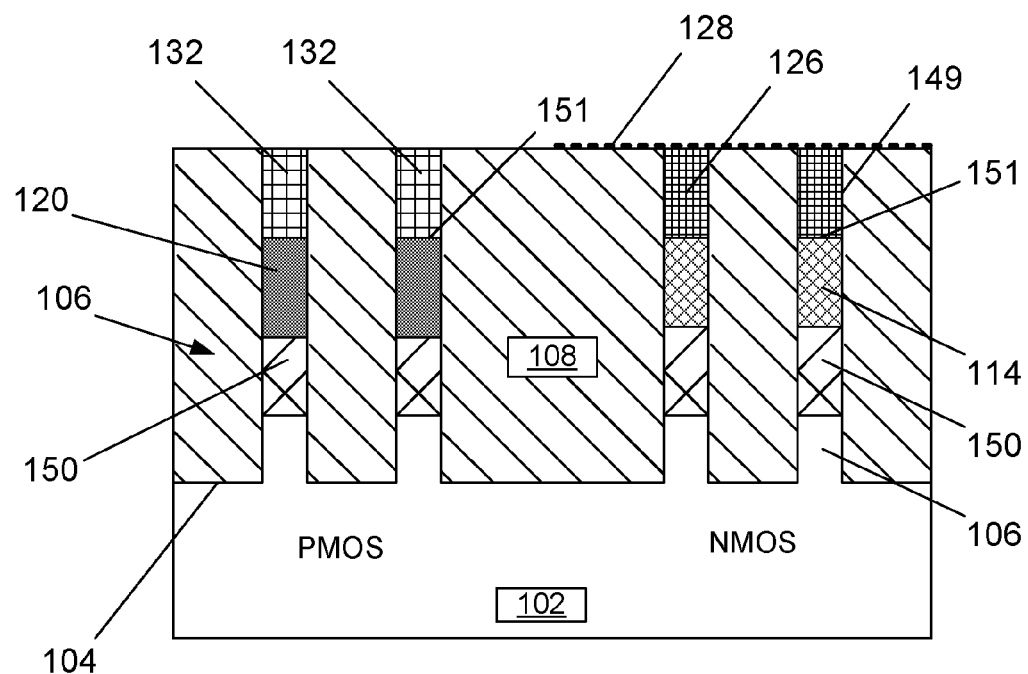

FIG. 3G depicts the product 100 after several process operations were performed. First, the above-described protection layer 128 was formed above both the NMOS and PMOS devices. Then, the portions of the protection layers 122, 128 above the PMOS device were removed by performing an etching process through another patterned masking layer (not shown). Next, the patterned masking layer was removed, leaving the remaining portion of the protection layer 128 in position above the NMOS device. Thereafter, another epitaxial deposition process was performed to form the above-described undoped semiconductor material 132 in the fin cavities 149 on the exposed upper, substantially defect-free upper surface 151 of the SRB layer 150 in the PMOS device. In general, the semiconductor material 132 may be made of a material that has a lattice constant that is greater than that of the material of the SRB layer 150 such that a compressive strain is created on the semiconductor material 132 when it is formed, which will tend to improve the mobility of the charge carriers (holes) of the PMOS device. In one illustrative embodiment, the lattice constant of the channel semiconductor material 132 for the PMOS device should be at least 0.2% greater than the lattice constant of the SRB layer 150. In one illustrative embodiment, the resulting channel semiconductor material 132 is a compressive-strained, substantially defect-free silicon germanium material with a germanium concentration that is at least 10% greater that the germanium concentration in the SRB layer 150. For example, if the SRB layer 150 is comprised of $Si_{0.8}Ge_{0.2}$, then the channel semiconductor material 132 should have a germanium concentration of at least 30% ($Si_{0.7}Ge_{0.3}$). In other embodiments, the channel semiconductor material 132 may be comprised of substantially pure germanium or a III-V material or compounds of such materials.

Figure 3H:
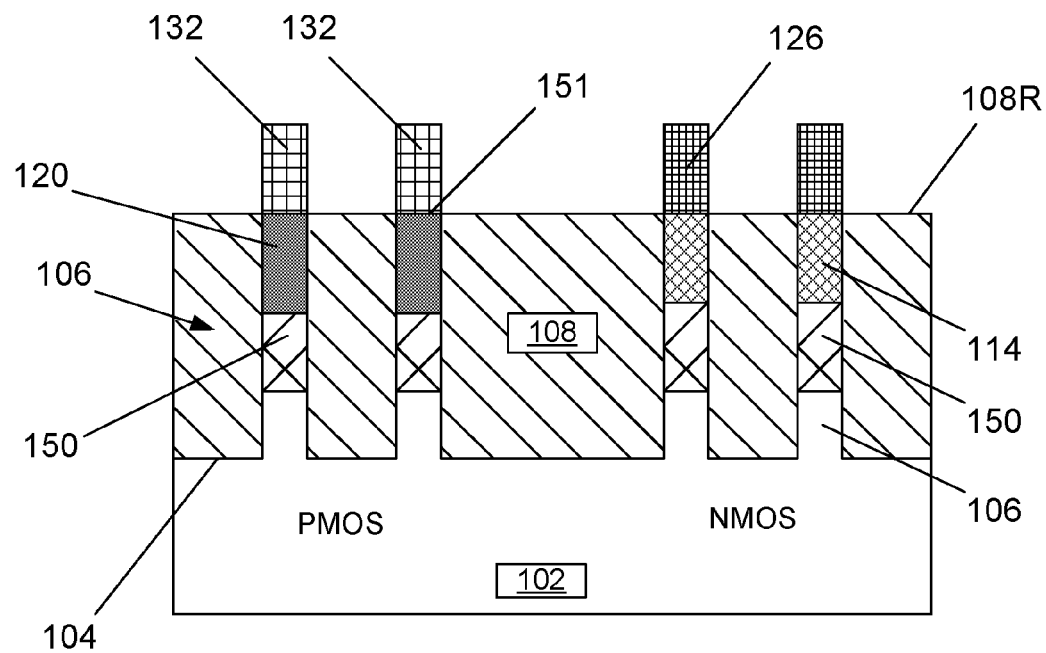

FIG. 3H depicts the product 100 after the remaining portions of the protection layer 128 (if still present) were removed and after the above-described recess etching process was performed on the layer of insulating material 108 so as to expose all or a portion of the semiconductor materials 126, 132 above the recessed upper surface 108R of the layer of insulating material 108.

At the point of processing depicted in FIG. 3H, the illustrative FinFET-based CMOS product 100 may be completed using traditional fabrication techniques. For example, the above-described gate structures 140P, 140N and gate cap layers 142 shown in FIG. 2N may be formed for the PMOS and NMOS devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device, comprising:
   forming a plurality of fin-formation trenches to thereby define a fin;
   performing at least one process operation to form a layer of insulating material in said plurality of fin-formation trenches;
   performing a densification anneal process on said layer of insulating material;
   after performing said densification anneal process, performing at least one ion implantation process to form a counter-doped well region in said fin;
   after forming said counter-doped well region, performing an epitaxial deposition process to form an undoped semiconductor material on an exposed upper surface of said fin;
   recessing said layer of insulating material so as to expose at least a portion of said undoped semiconductor material; and
   forming a gate structure around said exposed portion of said undoped semiconductor material.

2. The method of claim 1, wherein said FinFET device is formed above a semiconductor substrate comprising a substrate semiconductor material and wherein said upper surface of said fin consists of said substrate semiconductor material.

3. The method of claim 1, wherein said FinFET device is formed above a substrate comprising a strain relaxation buffer (SRB) layer comprised of a first semiconductor material that is positioned above a second semiconductor material that is different from said first semiconductor material and wherein said upper surface of said fin consists of said first semiconductor material.

4. The method of claim 3, wherein said first semiconductor material has a first lattice constant and said second semiconductor material has a second lattice constant that is different from said first lattice constant.

5. The method of claim 3, wherein said substrate further comprises a third semiconductor material that is positioned below said second semiconductor material, wherein said third semiconductor material is different from said first semiconductor material.

6. The method of claim 1, wherein, prior to forming said undoped semiconductor material on said exposed upper surface of said fin, the method comprises removing a portion of a patterned fin-formation mask positioned above said fin so as to expose said upper surface of said fin.

7. The method of claim 1, wherein performing said at least one process operation to form said layer of insulating material in said plurality of fin-formation trenches comprises:
depositing said layer of insulating material so as to over-fill said plurality of fin-formation trenches; and
performing a chemical mechanical polishing process to planarize an upper surface of said layer of insulating material.

8. The method of claim 1, wherein performing said densification anneal process on said layer of insulating material comprises performing said densification anneal process at a temperature that falls within a range of about 500-1200° C. for a duration of about 1-120 minutes.

9. The method of claim 1, wherein said FinFET device is an NMOS device, said counter-doped well region is a P-doped well region and said undoped semiconductor material comprises one of silicon, silicon carbon or silicon germanium.

10. The method of claim 1, wherein said FinFET device is an NMOS device and wherein said undoped semiconductor material is formed with a tensile strain.

11. The method of claim 1, wherein said FinFET device is a PMOS device, said counter-doped well region is an N-doped well region and said undoped semiconductor material comprises one of silicon germanium ($Si_{(1-x)}Ge_x$ where "x" ranges from 0.1-1), substantially pure germanium, or a III-V material.

12. The method of claim 1, wherein said densification anneal process is performed prior to performing said epitaxial deposition process.

13. The method of claim 1, wherein said densification anneal process is performed after performing a chemical mechanical polishing process on said layer of insulating material.

14. A method of forming a FinFET device, comprising:
forming a plurality of fin-formation trenches in a semiconductor substrate to thereby define a fin;
performing at least one process operation to form a layer of insulating material in said plurality of fin-formation trenches;
performing a densification anneal process on said layer of insulating material;
after performing said densification anneal process, performing at least one ion implantation process to form a counter-doped well region in said fin;
after forming said counter-doped well region, performing an epitaxial deposition process to form an undoped semiconductor material on an exposed upper surface of said fin;
recessing said layer of insulating material so as to expose at least a portion of said undoped semiconductor material; and
forming a gate structure around said exposed portion of said undoped semiconductor material.

15. The method of claim 14, wherein, prior to forming said undoped semiconductor material on said exposed upper surface of said fin, the method comprises removing a portion of a patterned fin-formation mask positioned above said fin so as to expose said upper surface of said fin.

16. The method of claim 14, wherein performing said densification anneal process on said layer of insulating material comprises performing said densification anneal process at a temperature that falls within a range of about 500-1200° C. for a duration of about 1-120 minutes.

17. A method of forming a FinFET device on a substrate comprising a strain relaxation buffer (SRB) layer comprised of a first semiconductor material, comprising:
forming a plurality of fin-formation trenches that extend at least partially into said SRB layer so as to define a fin, wherein at least a portion of said fin is comprised of said SRB layer;
performing at least one process operation to form a layer of insulating material in said plurality of fin-formation trenches;
performing a densification anneal process on said layer of insulating material;
after performing said densification anneal process, performing at least one ion implantation process to form a counter-doped well region in said SRB layer portion of said fin;
performing an epitaxial deposition process to form an undoped semiconductor material on an exposed upper surface of said SRB layer portion of said fin, said undoped semiconductor material comprising a second semiconductor material that is different from said first semiconductor material;
recessing said layer of insulating material so as to expose at least a portion of said undoped semiconductor material; and
forming a gate structure around said exposed portion of said undoped semiconductor material.

18. The method of claim 17, wherein forming said plurality of fin-formation trenches comprises:
performing an epitaxial deposition process to form said SRB layer on an upper surface of a semiconductor substrate;
forming a patterned fin-formation mask above said SRB layer; and
performing an etching process though said patterned fin-formation mask layer to define said plurality of fin-formation trenches, wherein said fin-formation trenches extend through said SRB layer and into said substrate and said fin comprises an upper portion comprised of said SRB layer and a lower portion comprised of said substrate.

19. The method of claim 17, wherein, prior to performing said epitaxial deposition process to form said undoped semiconductor material, the method further comprises removing at least a portion of said patterned fin-formation mask layer to thereby expose said upper surface of said SRB layer portion of said fin.

20. The method of claim 17, wherein performing said densification anneal process on said layer of insulating material comprises performing said densification anneal process at a temperature that falls within a range of about 500-1200° C. for a duration of about 1-120 minutes.

21. The method of claim 17, wherein said first semiconductor material has a first lattice constant and said second semiconductor material has a second lattice constant that is different from said first lattice constant.

22. The method of claim 21, wherein said FinFET device is an NMOS device, said counter-doped well region is a P-doped well region and said first lattice constant is at least 0.2% greater than said second lattice constant.

23. The method of claim 21, wherein said FinFET device is a PMOS device, said counter-doped well region is an N-doped well region and said first lattice constant is at least 0.2% less than said second lattice constant.

24. The method of claim 18, wherein said semiconductor substrate comprises a third semiconductor material that is different from said first semiconductor material.

25. The method of claim 17, wherein said SRB layer has a thickness that is greater than 1 μm than a critical thickness of said first semiconductor material and said exposed upper surface of said SRB layer portion of said fin is substantially free of defects.

26. The method of claim 17, wherein said FinFET device is an NMOS device, said counter-doped well region is a P-doped well region, said SRB layer comprises silicon germanium having a germanium concentration of 20% or less and said undoped semiconductor material comprises one of silicon, silicon carbon or silicon germanium.

27. The method of claim 17, wherein said FinFET device is a PMOS device, said counter-doped well region is an N-doped well region, said SRB layer comprises silicon germanium having a germanium concentration of 20% or less and said undoped semiconductor material comprises one of substantially pure germanium, a III-V material or silicon germanium having a germanium concentration that is greater than said germanium concentration of said SRB layer.

* * * * *